United States Patent
Matveev et al.

(10) Patent No.: US 6,876,006 B1
(45) Date of Patent: Apr. 5, 2005

(54) RADIATION SOURCE

(75) Inventors: Boris Matveev, St. Petersburg (RU);
Nonna Zotova, St. Petersburg (RU);
Natalia Il'Inskaya, St. Petersburg
(RU); Sergey Karandashov, St.
Petersburg (RU); Maxim Remennyi, St.
Petersburg (RU); Nikolai Stus', St.
Petersburg (RU); Georgii Talalakin, St
Petersburg (RU)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 10/031,251

(22) PCT Filed: Apr. 21, 2000

(86) PCT No.: PCT/EP00/03745

§ 371 (c)(1),
(2), (4) Date: May 7, 2002

(87) PCT Pub. No.: WO00/65665

PCT Pub. Date: Nov. 2, 2000

(30) Foreign Application Priority Data

Apr. 27, 1999 (RU) .......................................... 99109287
Nov. 23, 1999 (GB) ............................................ 9927612
Feb. 19, 2000 (GB) ............................................ 0003815

(51) Int. Cl.[7] ............................................. H01L 33/00
(52) U.S. Cl. ............................. 257/85; 257/80; 257/89; 257/90; 257/98
(58) Field of Search ............................. 257/85, 80, 89, 257/90, 98, 81, 83

(56) References Cited

U.S. PATENT DOCUMENTS 3,391,476 A    7/1968   Sher
3,611,069 A *  10/1971  Galginaitis et al. ........... 257/90
3,978,426 A    8/1976   Logan
4,028,146 A    6/1977   Logan (Continued)

FOREIGN PATENT DOCUMENTS

| EP | 0 434 233 A1 | 6/1991 |
| EP | 0 498 732 A2 | 8/1992 |
| EP | 0 540 799 A1 | 5/1993 |
| EP | 0 608 674 A1 | 8/1994 |

(Continued)

OTHER PUBLICATIONS

Matveev, "InAs(Sb)(P) and In(Ga)As(Sb) LEDS as a light source for high temperature (t=80÷180 C) optical sensing in the mid–IR (3÷5 μm) spectral range", 5th European Conference, France. Apr. 16–19, 2000, pp. 193–194.

Matveev, "Room temperature InAs photodiode—InGaAs LED pairs for methane detection in the mid–IR", Sensors and Actuators B, vol. 51, 1998, pp 233–237.

(Continued)

*Primary Examiner*—Jerome Jackson
(74) *Attorney, Agent, or Firm*—Barnes & Thornburg

(57) ABSTRACT

A radiation source (30) is provided comprising a first active layer (42) coupled to a second active layer (62), wherein the first active layer (42) produces primary radiation of frequency $v_1$ by appropriate stimulation, and the primary radiation is converted by the second active layer (62) to secondary radiation of frequency $v_2$ for subsequent output. The coupling between the first and second active layers is achieved by an intermediary layer (58) disposed between the first active layer (42) and the second active layer (62). The radiation source (30) further comprises a p-n junction (48) incorporated in the first active layer (42), where injection of electrical carriers into the first active layer (42) from the p-n junction stimulates the first active layer (42) to emit the primary radiation.

49 Claims, 2 Drawing Sheets

U.S. PATENT DOCUMENTS

| | | | |
|---|---|---|---|
| 4,190,813 A | 2/1980 | Logan | |
| 4,207,122 A | 6/1980 | Goodman | |
| 4,269,635 A | 5/1981 | Logan | |
| 4,374,390 A | 2/1983 | Lee | |
| 4,378,259 A | 3/1983 | Hasegawa | |
| 4,575,742 A | 3/1986 | Kohashi | |
| 4,636,821 A | 1/1987 | Yanase | |
| 4,775,876 A | 10/1988 | Moyer | |
| 4,810,670 A | 3/1989 | Furuyama | |
| 4,871,690 A | 10/1989 | Holonyak | |
| 4,925,811 A | 5/1990 | Menigaux | |
| 4,953,170 A | 8/1990 | Logan | |
| 4,955,030 A | 9/1990 | Menigaux | |
| 4,999,316 A | 3/1991 | Goodhue | |
| 5,020,067 A | 5/1991 | Okada | |
| 5,027,169 A | 6/1991 | Takahashi | |
| 5,039,627 A | 8/1991 | Menigaux | |
| 5,048,040 A | 9/1991 | Paoli | |
| 5,055,894 A | 10/1991 | Chan | |
| 5,071,786 A | 12/1991 | Paoli | |
| 5,107,306 A | 4/1992 | Blood | |
| 5,115,283 A | 5/1992 | Blondeau | |
| 5,115,284 A | 5/1992 | Kawasaki | |
| 5,115,285 A | 5/1992 | Menigaux | |
| 5,115,442 A | 5/1992 | Lee | |
| 5,153,890 A | 10/1992 | Bona | |
| 5,204,871 A | 4/1993 | Larkins | |
| 5,216,684 A | 6/1993 | Wang | |
| 5,247,190 A | 9/1993 | Friend | |
| 5,266,518 A | 11/1993 | Binsma | |
| 5,272,106 A | 12/1993 | Hirtz | |
| 5,446,751 A | 8/1995 | Wase | |
| 5,543,353 A | 8/1996 | Suzuki | |
| 5,585,957 A | 12/1996 | Nakao | |
| 5,689,358 A | 11/1997 | Nakao | |
| 5,812,578 A | 9/1998 | Schemmann | |
| 5,821,690 A | 10/1998 | Martens | |
| 5,828,088 A | 10/1998 | Mauk | |
| 5,852,304 A | 12/1998 | Suzuki | |
| 5,872,355 A | 2/1999 | Hueschel | |
| 5,952,681 A * | 9/1999 | Chen | 257/89 |
| 6,501,102 B2 * | 12/2002 | Mueller-Mach et al. | 257/84 |

FOREIGN PATENT DOCUMENTS

| | | |
|---|---|---|
| EP | 0 727 830 A2 | 8/1996 |
| EP | 0 874 402 A2 | 10/1998 |
| EP | 0 886 326 A2 | 12/1998 |
| EP | 0 905 797 A2 | 3/1999 |
| GB | 1 376 910 | 12/1974 |
| JP | 03171791 | 7/1991 |
| SU | 1428141 | 9/1986 |
| WO | WO 93 09569 A1 | 5/1993 |
| WO | WO 97 50133 A1 | 12/1997 |

OTHER PUBLICATIONS

Alferov, "Classical heterostructures paved the way", III–Vs Review, vol. 1 No. 1. 1998. pp 26–31.

Esina, "Investigation of the optical properties of InAs 1–x–y Sb x Px solid solutions", Sov Phys. Semicond., vol. 15, No. 12, 12/81, pp 1372–1373.

Matveev, "InAsSbP/InAs LEDs for the 3.3–5.5µm spectral range", IEEE proceedings online No. 19982303, vol. 145, No. 5. Oct. 1998, pp 254–256.

Berg, "Light Diodes", "Mir", Moscow 1979, p. 478.

* cited by examiner

RADIATION SOURCE

FIELD OF THE INVENTION

This invention relates to a radiation source and in particular to a radiation source incorporating semiconductor material and capable of emitting infrared (IR) radiation.

BACKGROUND TO THE INVENTION

Radiation sources made from semiconductor material are available which emit IR radiation from an active area consisting of $A^3B^5$ material and a p-n junction. The source is constructed on the basis of an n-InGaAs/p-InGaAs/n-InAs heterostructure and emits radiation of a wavelength in the range 2.5–4 µm. Typically such sources are used to measure the transmittance of a gas mixture in the hydrocarbon absorption band area of 3.3 µm. Such sources have a long lifetime (more than 30,000 hours) and a narrow spectrum of radiation (less than 0.4 µm), both of which allow these sources to be used in gas analysis equipment. However, these sources cannot work at temperatures above 80° C. Furthermore, these sources (sources with narrow band substrate) have top wire bonding, as a result of which it is difficult to incorporate them with fibres.

Other semiconductor sources of IR radiation are known which emit radiation in the near IR spectral range of the spectrum, i.e. around 1–2.5 µm, and are able to work at increased temperatures. However, the emitted wavelength is of limited usefulness.

The present invention aims to provide an improved radiation source for emission of IR radiation.

SUMMARY OF THE INVENTION

According to one aspect of the present invention, there is provided a radiation source comprising a first active layer coupled to a second active layer, wherein the first active layer produces primary radiation of frequency $v_1$ by appropriate stimulation, and the primary radiation is converted by the second active layer to secondary radiation of frequency $v_2$ for subsequent output. This two-step process allows the first active layer to emit at one frequency, with this frequency then being converted to a different frequency by the second active layer.

Additional active layers may be provided, such that each active layer is coupled to a previous active layer, and each active layer subsequent to the first active layer modifies the radiation produced by the previous active layer. In this way, the primary radiation may be modified as many times as necessary to produce output radiation of a desired frequency and/or to produce intermediate frequencies used for reference measurements.

Whilst the coupling of the first active layer to the second active layer may be achieved by affixing a surface of the first active layer to a surface of the second active layer, coupling may also be achieved by use of an intermediary layer disposed between the first active layer and the second active layer. The intermediary layer is preferably made of polymer compounds (epoxy) similar or close to those used for NIR LED encapsulation and paraffin's or liquids (suitable for construction of a source prototypes and investigations) or chalcogenic glasses. Both classes of intermediary layer have a variety of possible compositions, just to mention few glasses containing sulphur:

1) $As_2S_3$,
2) S(10–20%)-I(2–60%)-As(10–60%)-Sb(2–5%),
3) As(16–37%)-S(24–30%)-Te(20–41%)-Sb(2–23%),
4) As(16–38%)-Sb(2–18%)-S(20–30%)-Se(20–40%)-Br (4–17%).

These materials are substantially optically transparent to the primary radiation, so providing optical coupling between the first active layer and the second active layer, that is, to provide conditions for radiation from the first active layer to pass through the optical coupling layer to reach the second active layer without being modified in frequency and without strong reduction of intensity.

The intermediary layer preferably has a refractive index n which is less than or equal to the refractive index of the active layers positioned either side of the intermediary layer.

The first active layer may comprise a semiconductor junction, and thus the radiation source may further comprise an injection region incorporated in the first active layer, where injection of electrical carriers into the first active layer from the injection region stimulates the first active layer to emit the primary radiation. The injection region may be provided by a p-n junction, with appropriate electrical biasing.

The first active layer preferably has a direct band gap energy associated with the material from which it is made, with the second active layer being associated with a second band gap energy, the first band gap energy being much greater than the second band gap energy.

Desirably, the first active layer has a band gap energy in the range of 0.6 to 1.5 eV where the highest radiation efficiencies are available now for spontaneous and stimulated light sources (up to 30–50%). Using a wide band gap energy for the first active layer increases the efficiency of injection associated with the injection region, or p-n junction, at high temperatures. First active layer may produce spontaneous or stimulated emission and may be thus surrounded by confinement layers to create waveguide effect or by multilayer structure to create VCSEL. The second active layer may also contain several sublayers to provide suitable electron confinement of photopumped nonequlirium carriers. Together with active layer they may form structures with one or more heterojunctions, e.g. quantum dot structures, double heterostructure or superlattice with active layer thickness in the range of 10 nm to 10 µm or up to 100 µm for graded bad gap layers, and desirably the active layers satisfy the following conditions:

$$hv_{max} \leq E_{subsequent} + E_f * k < E_{previous} \quad (1)$$

$$1/\alpha_{entry} \leq d \leq 1/\alpha_{exit} \quad (2)$$

where $hv_{max}$ is the maximum energy for the recombined radiation spectrum in the subsequent additional active area, optically connected with the previous active layer; $E_{previous}$ is the band gap energy of the previous active layer optically connected with the present one; $E_{subsequent}$, $E_f$ are the band gap energy and the Fermi energy level of the subsequent optically connected additional active layer, respectively; d is the thickness of the subsequent optically connected additional active layer; $\alpha_{entry}$ and $\alpha_{exit}$ are the effective absorption coefficients for the radiation entering and exiting the subsequent additional active layer, respectively.

As the active layers are separate, yet coupled together, the materials of the respective active layers can readily be selected to have different characteristics, such as different band gap energies. Thus when using a first active layer and a second active layer, the material of the second active layer is desirably selected to respond to the primary radiation so as to produce a secondary radiation of frequency in the middle infra-red range.

Thus desirably the second active layer has a band gap energy of 0.1 to 0.6 eV

Preferably the first active layer is made of $A^3B^5$ material and/or its solid solutions, with appropriate dopants used where necessary. The examples are GaAs, InP, GaP, InGaAs, InGaAsP with Zn, Mn, Mg, Be as a p-type dopants and Sn. Te as a n-type dopants.

The second active layer is preferably made of GaSb, InAs, InSb and solid solutions made from these compounds and their combinations (heterostructures, superlattices and quantum dot structures) so as to produce an energy gap in the material which results in production of a secondary radiation having a frequency in the middle IR range during recombination. The second layer may be also doped to obtain desired emission efficiency and frequency. Doping is useful for the narrow gap materials such as InAs, InSb and their solid solutions since they have small density of states in a conduction band and therefore strong degeneration of the band at reasonably low donor concentrations (n~$10^{15}$ cm$^{-3}$). Thus emission at energies higher than energy gap can be easily achieved due to the Moss-Burshtein effect.

Preferred materials for the active layers include $InAs_{1-x-y}Sb_xP_y$ and $In_{1-x}Ga_vAs_{1-w}Sb_w$ where x+y<1, w<1 and v<1. The composition of these materials preferably varies over a given thickness, so as to produce a graded variation in the band gap energy across the material Thus typically a narrow band gap energy will exist at one edge of an active layer made from the graded material, with a wider band gap energy existing at the other edge. These graded materials preferably possess the radial symmetry of a unit cell.

Where the radiation source comprises at least one active layer made from a graded material, preferably the edge of the graded material with the narrow band gap energy adjoins the injection region. The second active layer may contain additional layer(s) (or cap(s)) with energy gap larger then the gap in the main absorbing layer to produce the "window effect" for the light generated during the hv1→hv2 phototransition process. The examples are InAsSbP/In(Ga)As(Sb)/InAsSbP, InAs/InAsSb/InAs, N$^+$-InAs/InAsSb/n$^-$-InAs, GaSb/InAsSb/GaSb, InP/InGaAs/InP double heterostuctures and InP/InAsP, InAs/InAsSb(Ga), GaSb/InAsSb(Ga), n$^+$-InAs/n$^-$-In(Ga)As, n$^+$-InAs/n$^+$-InAs, n$^+$-InSb/n$^-$-InSb, heterostructures where CAPS are marked in ITALIC, and narrow gap active layers marked as underlined.

The active layers may be doped with rare earths such as Gd, Er, Yb and some others since these dopants increase the external quantum Field of luminescence.

The radiation source may contain coating contacting active layer or active layer cap which reduce internal reflection losses. The preferred materials are abovementioned chalogenic glasses and polymer compounds. The coating may form Weierstrass sphere to form narrow far field pattern.

The radiation source may be a device incorporating a p-n junction, such as a light emitting diode.

It is believed that the invention overcomes the problem of temperature quenching associated with known sources of providing an LED with separated injection and recombination areas and dividing these areas, that is, creating the possibility of injecting in one material (say with Eg=1.4 eV) and recombining in the middle IR range in another material (say with Eg=0.25 eV), greatly increased efficiency of injection at high temperatures.

In that connection, several structures with the broad band p-n emitter area and narrow band active area made from InAs(Sb) In(Ga)As(Sb), InAsSbP -alloys with peak emission at λ=4.1, 3.7, and 3.3 μm (300 K) respectively have been fabricated and studied with respect to high temperature gas sensing.

The invention will now be described by way of example, and with reference to the accompanying drawings in which.

DESCRIPTION

Figure 1:
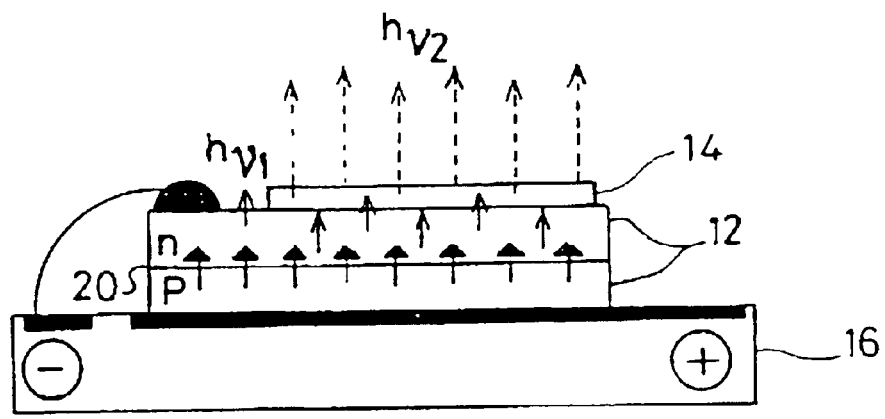
FIG. 1 is a schematic view of the radiation source in accordance with the present invention.

In FIG. 1, a schematic view of a radiation source in accordance with the present invention is shown. The device 10 comprises a first active area or layer 12 and a second active layer 14. Injection of electric charge carriers, such as electrons and holes, occurs in the first active layer 12, with recombination of carriers occurring in the second active layer 14 to produce an emitted radiation of a frequency which results in a wavelength in the middle IR spectrum, i.e. around 3–7 μm. The device has a layered structure with the first active layer 12 supported on a holder or base 16, to which electrical connections are made. A p-n junction 20 is supported on the uppermost surface of layer 12 and the second active layer 14 supported on the uppermost surface of the p-n junction 20.

In such a radiation source, the injection area and recombination area are divided, instead of being positioned in a single p-n or hereto-p-n structure. This allows the material for the recombination area to be selected independently of the material used for the injection area, and so permits selection of materials having the most appropriate characteristics for the respective areas. Thus by dividing these areas, injection can occur in one type of material, with a band gap energy of, for example, Eg=1.4 eV and recombination occur in another type of material with, for example, Eg=0.25 eV. This allows the recombination material to be selected to produce emitted radiation in the middle IR range, without affecting the selection of the injector (p-n junction) material.

If desired, an optical coupling layer can be placed between the p-n junction 20 and the second active layer 14, such that the second layer 14 interacts with the first layer 12 via the intermediate optical coupling layer.

Figure 2:
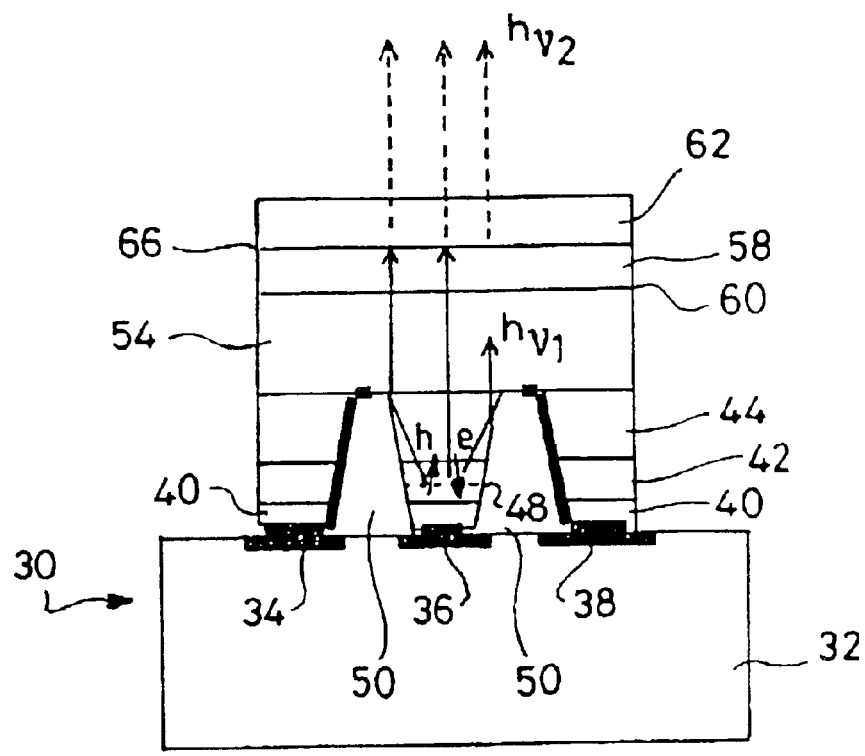
FIG. 2 is a sectional view through a semiconductor device in accordance with the present invention.

An embodiment of a semiconductor optoelectronic device incorporating the generalised features explained with reference to FIG. 1 is shown in FIG. 2. Semiconductor optoelectronic devices, and specifically those which act as sources of infrared (IR) radiation, can be used in gas analysis devices, spectrometers, and detector and communication systems.

The device of FIG. 2 comprises a plurality of different layers with appropriate electrical connections to enable it to function as a radiation emitter. Thus the device 30 comprises a holder 32 including electrical connections 34, 36 and 38, with an emitter layer 40 placed above the surface of the contacts 34, 36 and 38. A first active layer 42 made of a direct band-gap material is affixed onto the emitter layer 40 and above this first active layer a cladding layer 44 is deposited to form electrical confinement. The first active layer 42 incorporates a p-n junction 48 where injection of carriers occurs indicated as a flow of electrons (↓e) and holes (↑h). The layers 40, 42 and 44 are arranged such that they form a well for the injected carriers. The p-n junction lies within a well or at heterojunctions 40/42 or 42,44. The active injection area is thus limited to an isolated area within the first active layer 42, above the electrical contact 36. This results in the emitted radiation from the first active layer 42 being produced as substantially a cone of radiation.

Above the cladding layer 44, a substrate 54 is deposited through which primary radiation at a first frequency emitted by the first active layer 42 passes. An optical compound 58 adjoins the uppermost surface 60 of the substrate 54 and provides optical coupling between the first active layer 42 and a second active layer 62 placed on the uppermost surface of the optical compound 58. The uppermost surface of second layer is also known as the wide-gap surface of the graded-material, with surface 66 representing the narrow-gap surface of the graded material.

Instead of providing the optical compound 58 as a coupling link between the two layers, the layers can be affixed together by adhesive or a suitable cement.

The p-n junction is subjected to forward bias, which causes the carriers to be injected into the first active area 42. The carriers injected recombine, with emission of radiation in the near IR spectral range with energy $h\nu \cong E_{previous}$. The quanta thus formed leave the first active area at frequency $v_1$ and fall into the subsequent additional(second) active layer 62, optically connected with the first, where they are absorbed near to the surface 66. As a result, minor photo-excited carriers are formed in the second area 62, and in their turn recombine with energy close to $E_{subsequent} + E_f^* k$, where k=0 for non-degenerated material and k=1 for degenerated. The quanta thus produced, which have a frequency $v_2$ corresponding to the middle IR spectral range, leave the additional active area 62 and create an output radiation suitable for practical application.

The separation of the first and second active layers as shown in the devices of FIGS. 1 and 2 allows different materials to be selected for injection in the first layer, and recombination in the second layer.

Typically, the active layers comprise semiconductors from groups III and V of the periodic table, with different $A^3B^5$ materials and/or their solid solutions used for the different active layers, so that the active layers can be selected to have different band gap energies. Using III–V based emitters ensures there is sufficient thermal conductivity in the different layers for thermal stability and also that the device has stability against moisture.

By having separate active layers for injection and recombination, the final emitted wavelength of the source can be chosen from a wide range, and producing such devices is simplified as relatively thick layers of doped semiconductor material can be used when forming the device. It is possible to use a cascade of active layers made from different materials to produce an output radiation with a desired wavelength, and thus 3, 4, 5 or a plurality of active layers can be used in sequence within a device to achieve a particular output radiation.

Figure 3:
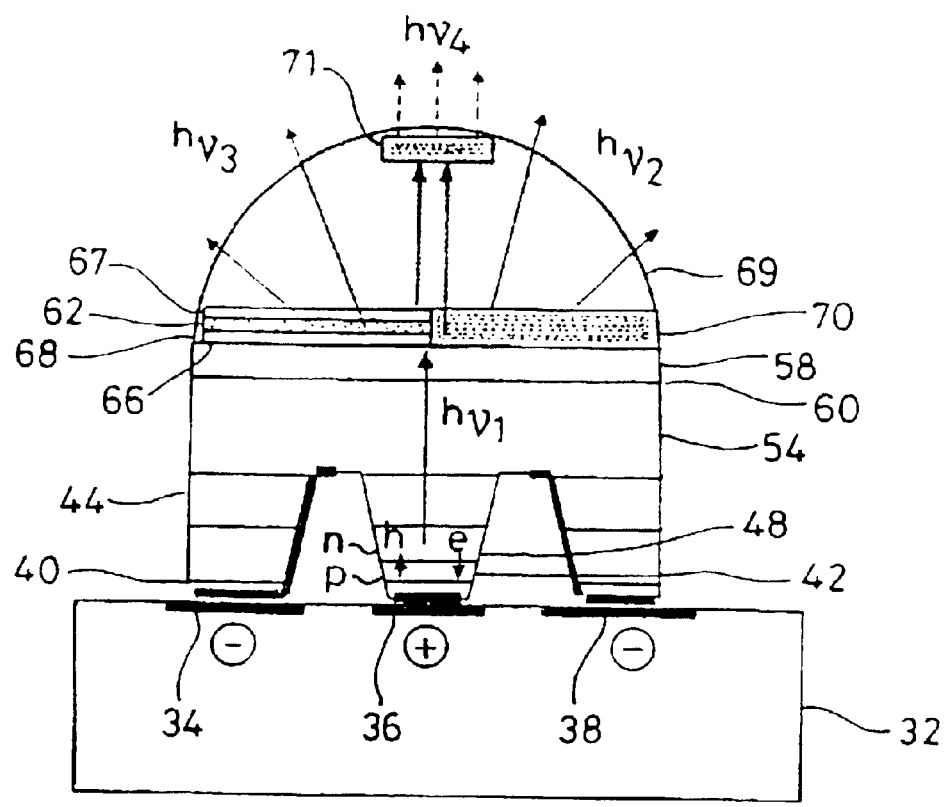
FIG. 3 is a sectional view through a second embodiment of a semiconductor device in accordance with the present invention and FIG. 4 is a sectional view through a third embodiment of a semiconductor device in accordance with the present invention.

The device of FIG. 3 has many features similar to those of the embodiment shown in FIG. 2 and such features are denoted by the corresponding reference numerals used in FIG. 2. The device shown in FIG. 3 comprises a plurality of different layers with appropriate electrical connections to enable it to function as a radiation emitter. Thus the device comprises four active layers: 42 (first layer) and 62, 70, 71(subsequent layers). Active layer 62 emitting at frequency $hv_2$ comprises double heterostructure with cladding layers 67, 68. The purpose of the claddings is to accumulate photopumped carriers in active layer far from the surface where high nonradiative recombination which is normally found in III–V narrow band semiconductors.

Layer 70 has energy gap which differs from that of layer 62 thus producing radiation with second frequency $hv_3 \neq hv_2$.

The uppermost surfaces of layers 62, 70 are coated by glass or compound 69 having refractive index smaller than that of 62 or/and 70 layer materials. The purpose of the coating 69 is to decrease reflection losses of $hv_2$, $hv_3$ radiation exiting the layers 62 and 70 correspondingly. The shape of the coating may be made in a such a way as to collimate radiation exiting the light source (e.g. with Weierstrass sphere). The active layer 71 is placed on top of the coating 69 in order to make optical connection to the radiation $hv_2$, $hv_3$ which passes through coating 69. The $hv_2$ or/and $hv_3$ radiation is absorbed in the subsequent active layer 71 with subsequent emission at $hv_4$ frequency.

By using an injector (p-n junction) material with a wide energy band gap, the efficiency of injection at high temperatures is greatly increased. The apparent inefficiency caused by additional phototransformation of quanta formed in the first active layer 42 and radiated in the subsequent optically connected active layer 62 by the absorption and recombination process hv1--+hv2, is overcome by the gain in efficiency of injection. Moreover, in most narrow band semiconductor light sources due to high electron mobility the recombination occurs in the p-type side of a p-n junction. However, p-InAs and related compositions (InAs(Sb), Iia (Ga)As, InAs(P), . . . ) suffer from strong Auger recombination and thus low quantum efficiency at room temperature is expected. Therefore creation of a separate active layer (first and second active layers may be fabricated separately) permits to make any desired layer doping procedure (including n-type doping or/and rare earth gettering) without reference to parameters governed by technological process of p-n junction creation in the narrow band material. The obtained freedom in the choice of active layer parameters permits thus to design source to work effectively in the middle IR spectral range at high temperatures, and be simple and cheap to construct. The band gap energy and the thickness of each subsequent active layer relative to the previous active layer satisfy the correlations:

$$hv_{max} \leq E_{subsequent} + E_f^* k < E_{previous}$$

$$1/\alpha_{entry} \leq d \leq 1/\alpha_{exit}$$

where $hv_{max}$ is maximum energy for the recombined radiation spectrum in the subsequent additional active area, optically connected with the previous active layer;

$E_{previous}$ is the band gap energy of the previous active layer optically connected with the present one;

$E_{subsequent}$. $E_f$ are the band gap energy and the Fermi energy level of the subsequent optically connected additional active layer, respectively;

d is the thickness of the subsequent optically connected additional active layer. Typical thickness range is from 10 nm to 10 µm or up to 100 µm for the graded crystals $\alpha_{entry}$ and $\alpha_{exit}$ are the effective absorption coefficients for the radiation entering and exiting the subsequent additional active layer, respectively (typically $\alpha_{entry} = 5 \cdot 10^3 - 10^5$ cm$^{-1}$, $\alpha_{exit} = 5 \cdot 10^2 - 10^4$ cm$^{-1}$);

and there is, between two active layers, at least one layer of a substance with a refractive index of n which optically couples the two layers and which satisfies the correlation:

$$1 < n \leq n_{previous, subsequent}$$

where $n_{previous, subsequent}$ are the refractive indices for the previous and subsequent active layers, respectively.

Introducing additional active layers, optically connected with the first and consisting of $A^3B^5$ material and/or its solid solutions, into the device structure, with an energy band gap that satisfies the specified correlations, and with the space (gap) between the active areas filled with a substance with a refractive index n, which satisfies the conditions $1<n\leq n_{previous, subsequent}$, leads to the creation of a p-n junction (injector) in the material with a wide band gap. This greatly increases the efficiency of injection at high temperatures and also reduces the loss of radiation output received in the middle IR area at high temperatures, in so far as the angle of full internal reflection is increased at the edge of the previous and subsequent optically connected active areas. This leads to an increase in the source's efficiency.

The introduction into a device such as an LED of a second active layer, optically connected with a previous active layer and consisting of $A^3B^5$ material and/or its solid solutions, creates the possibility of transforming the wavelength of the radiation exiting from the previous optically connected active area in a given wavelength range. $A^3B^5$ materials are preferred as they have a high absorption coefficient and a high internal quantum yield value. The application of other substances (for example, $A^2B^6$) is generally ineffective, because their quantum yield is not great and they are less stable, especially at high temperatures and in moist atmospheres. The choice of energy band gap for the additional active area (taking into account k=0) for non-degenerated material and k=1 for degenerated) allows the radiation exiting from the previous optically connected active area to be absorbed.

Failure to fulfil the condition $E_{subsequent}+E_f*k<E_{previous}$ leads to an absence of photoexcitation of the carriers in the second active layer, because of the sharp drop in the absorption coefficient at energy levels below $E_{subsequent}+E_f*k$. The intended application of the source, and the emitted radiation wavelength required, determines the $hv_{max}$ value. For sources used in gas analysers, the $hv_{max}$ value usually coincides with the absorption band of substances analysed. The $hv_{max}$ parameter must agree with the width of the forbidden band in the additional optically connected active area, that is, $hv_{max} \leq E_{subsequent}+E_f*k$.

Fulfillment of the condition $d \geq 1/\alpha_{entry}$ ensures that most of the radiation exiting from the previous optically connected active layer will be absorbed. When $d<1/\alpha_{entry}$ in the additional active layer, approximately $\frac{2}{3}^{rds}$ less of the overall flow from the near IR radiation will be absorbed ($I=I_0 \exp(-\alpha d)$); this leads to a reduction in the efficiency of the transformation (output) of radiation and renders it impossible to use the source in practice. The condition $d \leq 1/\alpha_{exit}$ must be fulfilled for the radiation from the middle IR range to be emitted effectively from the second active layer. If this condition is not fulfilled, much of the radiation will be reabsorbed in the second active layer, so reducing the intensity of the radiation emitted.

By making the first and second active layers of graded band gap $A^3B^5$ materials and/or their solid solutions, a range of sources with different emitted wavelengths can be provided as the growth of layers allows material with the required energy band gap to be produced. The narrow-gap active layer material is typically graded InAsSb(P) compositions which are lattice mismatched with an InAs substrate, and have high quality and high quantum efficiency.

These graded layers can be produced with the radial symmetry of a unit cell using the LPE growth method to produce epilayers having low dislocation density and plastically deformed substrates with high dislocation density.

When the narrow-band gap surface is placed adjacent to the p-n junction, the effective absorption coefficient $\alpha_{exit}$ is sharply reduced, since the wide-gap areas of graded band gap material produce a 'window' effect for the radiation formed in the narrow-gap part. The $\alpha_{exit}$ calculation for the graded band gap material is set out in A.Berg & P.Din, "Light Emitting Diodes", "Mir". Moscow, 1979, p578, and N. P. Esina et al, Sov Phys Semicond, Vol. 15(1981), No 12, pp1372–4. In this way it becomes possible to use sufficiently thick layers (about 20–60 $\mu$m, $\forall E_g$=2–30 meW/$\mu$m), which, given the fragility of the $A^3B^5$ materials, makes the technological process of producing the devices simpler. Positioning the narrow-gap surface adjacent to the exiting radiation side (that is, positioning the wide-gap surface adjacent to the p-n junction) leads to a significant reduction in the source's efficiency because of the absorption of exiting light.

Examples of implementations of the device depicted in FIG. 2 are now discussed below.

EXAMPLE 1

The device in this example was produced by growing layers using the method of liquid-phase epitaxy(LPE) on a $n^{--InP\ (Sn)\ substrate\ oriented\ in}$ (100) plane. Firstly a layer of undoped n-InGaAsP with $E_g$=1.19 eV and thickness of d~1.0 $\mu$m was grown and this followed by a layer of undoped n-InGaAsP ($E_g$=1.01 eV. D~0.4 $\mu$m), and then a layer of p+-InGaAsP, doped with Zn ($E_g$=1.01 eV, d~4.7 $\mu$m). The composition of the second layer was optimized for receiving radiation in the range of 1.21–1.23 $\mu$m at room temperature. The epitaxial structure was cleaved into rectangular chips 1×1×0.35 mm$^3$ in size, which were soldered with indium on a standard TO-18 holder with the p-layer downwards. The n-contact was made of indium on an InP surface, so that the free InP surface was 1×0.9 mm$^2$ in size. For the second layer, indium arsenide of 2–4 $\mu$m thickness was used, with n- type conductivity where n=5×10$^{16}$ cm$^{-3}$. The layer was fastened to the $n^{+-InP\ (Sn)\ surface\ by\ point\ soldering\ with\ indium}$. The source thus produced was supplied with continuous current $_{at}$ 30 mA and radiated at a wavelength of 3.5 $\mu$m with a radiation spectrum half-width of 0.4 $\mu$m. The radiation was recorded up to and including a temperature of 130° C., at which the spectrum peaked at 3.6 $\mu$m.

EXAMPLE 2

In the device according to Example 2, the epitaxial structure for the first active area is identical to that described in Example 1. Using standard photolithographical methods, a deep mesa 400 $\mu$m in diameter was created on the epitaxial structure, and an ohmic contact (Cr+Au) 260 mm in diameter was formed by vacuum sputtering. The contract with the n- area (Cr+Au) was horseshoe-shaped and was sputtered both onto the p-area outside the mesa and onto the n-area on the slopes of the outer mesa. The contacts were then strengthened by additional precipitation of galvanic gold. The crystals with the mesa structures and contacts were cut into rectangular chips of dimensions 0.3×0.9×1 mm$^3$ and mounted onto a carrier(submount) of semi-insulating silicon of dimensions 0.4×1.5×1.7 mm$^3$ with contact areas of Sn+Pb. The narrow-gap active area was created as follows. On the indium arsenide substrate, a gradient layer of InAsSbP was grown, 60 $\mu$m thick, with an InAs$_{0.92}$Sb$_{0.08}$ compound on the surface and an increase in phosphorus content towards the substrate, with a band gap gradient of 1–2 meV/$\mu$m. After the growth process, the InAs substrate was chemically etched off, leading to a final thickness for the layer of 20 $\mu$m. The gradient layer achieved was fixed by spot soldering the narrow-zone surface to the InP sublayer using indium. The emitter produced using the above method radiated at a wavelength of 4.2 μm near the carbon dioxide absorption band and showed a stable performance up to and including 90° C.

EXAMPLE 3

The radiation source was produced as described in Example 2. However, the gap between the InP substrate and the InAsSbP layer was filled with an optical polymer compound (epoxy), transparent in the near IR region. The radiation output of the source was 2–3 times higher than in Example 2.

EXAMPLE 4

The radiation source was produced as described in Example 2. However, the first active layer was made of GaAs sandwiched between GaAlAs claddings. Several mesas have been made on a pumping LED chip all being bonded p-side down to the Si carrier (submount). The top of GaAs LED was covered by heterostructure consisting of 70 μm thick n-InAs substrate (cap) and 1.5 μm thick $InAs_{0.92}Sb_{0.08}$ active layer deposited onto InAs by LPE method. The heterostructure was cemented to GaAs LED surface by a As(16–38%)-Sb(2–18%)-S(20–30%)-Se(20–40%)-Br (4–17%) glass. The same glass was deposited onto the n-InAs cap. The radiation output of the source was 2–3 times higher than in Example 3.

EXAMPLE 5

This radiation source was generally produced as described in Example 1. However the second active layer was composed of 70 μm thick $n^+$ InAs (n=2 $10^{18}$ cm $^{-3}$, cap) and 1.5 μm thick Gd doped n-InAs(n<2 $10^{16}$ cm $^{-3}$) active layer deposited onto InAs by LPE method. The radiation output of the source was 2–3 times higher than in Example 1.

EXAMPLE 6

This radiation source was generally produced as described in Example 1. However the second active area was positioned perpendicular to the p-n junction and parallel to (011) crystal plane. The p-n junction was supplied with short impulses (less than 1 μs) with a range of current of 7A. The radiation output was higher than with the methods mentioned above, and higher than Example 2, because the first active area began working in a stimulated regime.

EXAMPLE 7

The source was produced as described in Example 3, however the InAsSbP layer area was half the size, and the freed area on the InP surface was covered with an InAs layer, identical to those described in Example 1, so as to create a third active layer. The source produced radiated simultaneously in two wavelengths: 4.2 μm and 3.5 μm.

EXAMPLE 8

The first active area and the p-n junction were produced as in the previous examples. Second and third active layers, consisting of gradient layers of $InAs_{1-x-y}Sb_wP_w$ and $In_{1-x}Ga_yAs_{1-w}Sb_w$ where placed on the InP surface with compositions on the narrow-zone surface: x=0.2, y=0, v=0.1. The faces of the second and third active areas were rectangular in shape and were firmly joined to each other along the line that divided the InP surface into two equal parts as normal. When voltage was applied to the p-n junction, the source radiated on two wavelengths: 5.5 μm and 3.9 μm, which corresponded to the phototransformation in the respective second and third active layers. Similar two- and multi-wave sources may be used in optical gas analysers with several measurement channels.

EXAMPLE 9

This source had the same component parts as in Example 5, however the second and third active layers were positioned in sequence according to ray movements. The second active layer of InGaAsSb layer was joined to the InP using a compound, and the third active layer of InAsSbP was placed 10 mm away from the InGaAsSb. This positioning of the areas allowed the production of a ray with a consistently changing wavelength (3.8–5.5 μm), suitable for use in spectroscopy.

EXAMPLE 10

Figure 4:
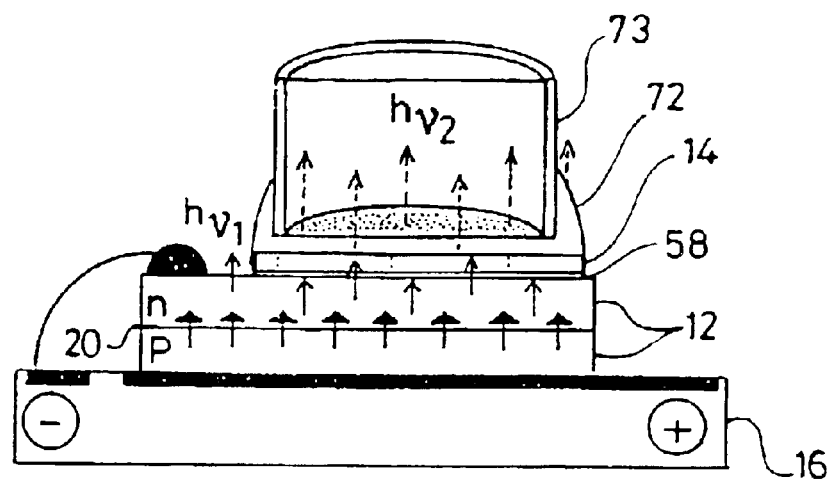

The source was produced as described in Example 1, however the second active layer was composed of $n^+$-InSb/n-InSb structure fabricated by LPE method. The 2 μm thick n-InSb active area adjoined the InP LED top layer through the As(16–37%)-S(24–30%)-Te(20–41%)-Sb(2–23%) glass (72). The source emitted at 6 μm (300K). To couple the source with $As_2S_3$ fibre (73) the latter was glued by the glass mentioned in Example 4 as shown in FIG. 4, in which elements corresponding to those of FIGS. 1 and 2 are denoted by the corresponding reference numerals in FIGS. 1 and 2.

EXAMPLE 11

The source was produced as described in Example 1, however the second active layer was composed of InAsP/InP structure with the increase of phosphors content towards InP substrate. The 15 μm thick graded n-InAsP active area fabricated by LPE method adjoined the InP LED top layer through the As(16–37%)-S(24–30%)-Te(20–41%)-Sb (2–23%) glass. The source emitted at 2.1 μm with FWHM of about 0.3 m at room temperature. Preliminary evaluation shows that InAsSb-based radial 'symmetry' LEDs will be very stable with a narrow emission band (FWHM<600 nm), high output power (over 50 000 nW) and will be several times cheaper. Thus these LEDs will enable to decrease the limit of detection by factor 2–4 since most gases (NO is an example) have narrow absorption bandwidth (FWHM~200 nm).

EXAMPLE 12

The source was produced as described in Example 2, however the second InAsSbP graded band gap active layer was 60 μm thick and was intentionally doped with Gd from the melt during the layer growth. For a comparison three reference samples (No 1, No 2, No 3) have been grown so that the Gd concentration (N) increased with sample number, that is, $N_{Gd4}>N_{Gd3}>N_{Gd4}>N_{Gd1}$. At low temperatures (77 K) all InAsSbP layers had nearly similar PL peak position (345 meV) but slightly different PL integral intensity which has a maximum value for sample N4 and which is 2-fold higher than for the undoped sample N1.

The room temperature emission spectra for four sources assembled from the above InAsSbP (Gd) layers peaked at 280–285 meV (carbon dioxide absorption peak) with the corresponding value of transmission of 0.3. The brightest LED (No 4) corresponds to the highest doping level and was four times brighter when compared to the source in Example 2.

EXAMPLE 13

The source was produced as described in Examples 2 or 12, however, the second InAsSbP graded band gap active layer was 25 µm thick only and has energy gap gradient of about 3–5 meV/µm. The active layer transmission was about 0.6 at peak energy; integral efficiency was twice of that of the best device described in Example 12.

EXAMPLE 14

The second source active layer was composed of ~5 µm thick n-$In_{1-x}Ga_yAs_{1-w}Sb_w$ (Gd or Yr dopants) quaternary alloy with v=w=0.06 grown onto 350 µm thick $n^+$-InAs(100) ($n^+$~2 $10^{18}$ cm$^{-3}$) by LPE method. Prior to assembly of the source, a substrate was nearly etched off with final thickness of about 40 µm. Then quaternary alloy was also etched to achieve maximum signal of 300 K transmission photoluminescence intensity. Thus the final $In_{1-y}Ga_yAs_{1-w}Sb_w$ thickness was about 2–5 µm. The upper surface of a GaAs pumping source with the first active layer was attached to a 500 µm thick sapphire disc with D=5 mm through a chalcogenic glass. Top (free) sapphire surface was optically coupled via chalcogenic glass to the second ($In_{1-x}Ga_yAs_{1-w}Sb_w$) active layer. Thus the short wavelength light passes from the first to the second active layers through first chalcogenic glass layer, the sapphire disc and finally through second chalcogenic glass layer. The source emitted at 3.5–3.3 µm wavelengths and exhibited linear light-current behaviour due to good heat sinking through sapphire disc. Thus it was possible to use higher pumping currents than in all previous examples, thereby to achieve higher outputs.

Thus the invention allows the creation of reliable and effective ambient operating light emitting diodes (LEDs) which emit in the 3000 to 6500 nm spectral range and which can be used as light sources for infrared analysers including the fibre optic ones. The spectral range for the source operation can be extented to 9000–14000 nm range by appropriate choice of the second layer composition and layer arrangement.

What is claimed is:

1. A radiation source comprising a first active layer coupled to a second active layer, wherein the first and second active layers are separate, the first active layer produces primary radiation of frequency $v_1$ by appropriate stimulation, and the primary radiation is converted by the second active layer to secondary radiation of frequency $v_2$ for subsequent output and wherein coupling occurs by an intermediary layer disposed between the first active layer and the second active layer, the intermediary layer comprising a noncrystalline material.

2. A radiation source according to claim 1, wherein additional active layers are provided, such that each active layer is coupled to a previous active layer, and each active layer subsequent to the first active layer modifies the radiation produced by the previous active layer.

3. A radiation source according to claim 1, wherein the intermediary layer is substantially optically transparent to the primary radiation, so providing optical coupling between the first active layer and the second active layer.

4. A radiation source according to claim 1, wherein the intermediary layer has a refractive index n which is less than 1, and less than or equal to the refractive index of the active layers positioned either side of the intermediary layer.

5. A radiation source according to claim 1, wherein the first active layer comprises a semiconductor junction.

6. A radiation source according to claim 1, wherein the radiation source further comprises an injection region incorporated in the first active layer, where injection of electrical carriers into the first active layer from the injection region stimulates the first active layer to emit the primary radiation.

7. A radiation source according to claim 6, wherein the injection region is a p-n junction.

8. A radiation source according to claim 1, wherein a first band gap energy is associated with the first active layer, and a second band gap energy is associated with the second active layer, the first band gap energy being much greater than the second band gap energy.

9. A radiation source according to claim 1, wherein the active layers satisfy the following conditions:

$$hv_{max} \leq E_{subsequent} + E_f * k < E_{previous}$$

$$1/\alpha_{entry} \leq d \leq 1/\alpha_{exit}$$

where $hv_{max}$ is the maximum energy for the radiation produced in a subsequent active layer optically connected with a previous active layer;

$E_{previous}$ is the band gap energy of the previous active layer;

$E_{subsequent}$, $E_f$ are the band gap energy and the Fermi energy level of the active layer, respectively;

d is the thickness of the subsequent active layer;

$\alpha_{entry}$ and $\alpha_{exit}$ are the effective absorption coefficients for the radiation entering and exiting the subsequent active layer, respectively.

10. A radiation source according to claim 1, wherein the active layers are made of $A^3B^5$ material and/or its solid solutions.

11. A radiation source according to claim 10, wherein at least one active layer comprises $InAs_{1-x-y}Sb_xP_y$, where x+y<1.

12. A radiation source according to claim 10, wherein at least one active layer comprises $In_{1-y}Ga_yAs_{1-w}Sb_w$, where x+y<1, w<1 and v<1.

13. A radiation source according to claim 1, wherein the first active layer and the second active layer are made from a material with a graded variation in band gap energy.

14. A radiation source according to claim 2, wherein the additional active layers are made from a material with a graded variation in the band gap energy.

15. A radiation source according to claim 14, wherein the material with a graded variation possesses the radial symmetry of a unit cell.

16. A radiation source according to claim 14, wherein the material with a graded variation adjoins the injection region along one edge where the material has a narrow band gap energy.

17. A radiation source according to claim 1, wherein the radiation source is a light emitting diode.

18. A radiation source according to claim 1, in which the intermediary layer comprises two bonding layers each attached to a respective active layer, and a heat sink layer interposed between the two bonding layers, the heat sink layer being operable to conduct heat away from the active layers.

19. A radiation source according to claim 18, in which the heat sink layer is composed of sapphire.

20. A radiation source according to claim 19, in which each bonding layer is composed of chalcogenic glass and the sapphire layer is sandwiched between the glass layers.

21. A radiation source according to claim 1, wherein the output of the radiation source is in the IR frequency range.

22. A radiation source according to claim 1, in which an optical fibre is attached to the second active layer.

23. A radiation source according to claim 1, wherein the active layers are made of a semi conductor material.

24. A radiation source according to claim 1, in which the intermediary layer is made of polymer compounds and parafins or liquids.

25. A radiation source according to claim 1, in which the intermediary layer is made of chalcogenic glass.

26. A radiation source according to claim 1, in which the source has a coating in contact with an active layer or active layer cap, said coating reducing internal reflection losses.

27. A radiation source according to claim 26 in which the coating is of chalcogenic glass.

28. A radiation source according to claim 26, in which the coating forms a Weierstrass sphere for forming a narrow far field pattern.

29. An infrared radiation source comprising a first active semiconductor layer coupled to a second active semiconductor layer, wherein the first active layer produces primary radiation of frequency $v_i$ by appropriate stimultaion, and the primary radiation is converted by the second active layer to secondary radiation of frequency $v_2$ for subsequent output, and an intermediary layer disposed between the first semiconductor layer and the second semiconductor layer.

30. A radiation source according to claim 29, wherein additional active layers are provided, such that each active layer is coupled to a previous active layer, and each active layer subsequent to the first active layer modifies the radiation produced by the previous active layer.

31. A radiation source according to claim 29, wherein the intermediary layer is substantially optically transparent to the primary radiation, so providing optical coupling between the first active layer and the second active layer.

32. A radiation source according to claim 29, wherein the intermediary layer has a refractive index n which is greater than 1, and less than or equal to the refractive index of the active layers positioned either side of the intermediary layer.

33. A radiation source according to preceding claim 29, wherein the radiation source further comprises an injection region incorporated in the first active layer, where injection of electrical carriers into the first active layer from the injection region stimulates the first active layer to emit the primary radiation.

34. A radiation source according to claim 33, wherein the injection regions is a p-n junction.

35. A radiation source according to claim 29, wherein a first band gap energy is associated with the first active layer, and a second band gap energy is associated with the second active layer, the first band gap energy being much greater than the second band gap energy.

36. A radiation source according to claim 29, wherein the active layers satisfy the following conditions:

$$hv_{max} \leq E_{subsequent} + Ef^*k < E_{previous} \quad (1)$$

$$1/\alpha_{entry} \leq d < 1/\alpha_{exit} \quad (2)$$

where $hv_{max}$ is the maximum energy for the radiation produced in a subsequent active layer optically connected with a previous active layer;

$E_{previous}$ is the band gap energy of the previous active layer;

$E_{subsequents}$, $E_f$ are the band gap energy and the Fermi energy level of the active layer, respectively;

d is the thickness of the subsequent active layer;

$\alpha_{entry}$ and $\alpha_{exit}$ are the effective absorption coefficients for the radiation entering and exiting the subsequent active layer, respectively.

37. A radiation source according to claim 29, wherein the layers are made of A3B5 material and/or its solid solutions.

38. A radiation source according to claim 29, wherein the first active layer and the second active layer are made from a material with a graded variation in band gap energy.

39. A radiation source according to claim 30, wherein the additional active layers are made from a material with a graded variation in the band gap energy.

40. A radiation source according to claim 39, wherein the material with a graded variation possesses the radial symmetry of a unit cell.

41. A radiation source according to claim 40, wherein the material with a graded variation adjoins the injection region along one edge where the material has a narrow band gap energy.

42. A radiation source according to claim 29, wherein the radiation source is a light emitting diode.

43. A radiation source according to claim 29, in which the intermediary layer comprises two bonding layers each attached to a respective active layer, and a heat sink layer interposed between the two bonding layers, the heat sink layer being operable to conduct heat away from the active layers.

44. A radiation source according to claim 43, in which the heat sink layer is composed of sapphire.

45. A radiation source according to claim 44, in which each bonding layer is composed of chalcogenic glass and the sapphire layer is sandwiched between the glass layers.

46. A radiation source according to claim 29, in which the intermediary layer is made of polymer compounds and parafins or liquids.

47. A radiation source according to claim 29, in which the intermediary layer is made of chalcogenic glass.

48. A radiation source according to claim 29, in which the source has a coating in contact with an active layer or active layer cap, said coating reducing internal reflection losses.

49. a radiation source according to claim 48 in which the coating forms a Weierstrass sphere for forming a narrow far field pattern.

* * * * *